(12) United States Patent
Newns

(10) Patent No.: US 8,125,823 B2
(45) Date of Patent: Feb. 28, 2012

(54) METHOD AND STRUCTURE FOR ULTRA-HIGH DENSITY, HIGH DATA RATE FERROELECTRIC STORAGE DISK TECHNOLOGY USING STABILIZATION BY A SURFACE CONDUCTING LAYER

(75) Inventor: Dennis M. Newns, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/546,349

(22) Filed: Aug. 24, 2009

(65) Prior Publication Data
US 2009/0310472 A1 Dec. 17, 2009

Related U.S. Application Data

(62) Division of application No. 10/697,271, filed on Oct. 31, 2003, now Pat. No. 7,754,353.

(51) Int. Cl.
*G11C 11/34* (2006.01)
(52) U.S. Cl. ........................................ 365/177; 369/126
(58) Field of Classification Search .................. None
See application file for complete search history.

(56) References Cited

U.S. PATENT DOCUMENTS

| | | | |
|---|---|---|---|
| 5,316,830 A | 5/1994 | Adams et al. | |
| 5,519,235 A | 5/1996 | Ramesh | |
| 5,666,305 A | 9/1997 | Mihara et al. | |
| 6,335,207 B1 | 1/2002 | Joo et al. | |
| 6,491,789 B2 | 12/2002 | Niu | |
| 6,495,879 B1 * | 12/2002 | Kobayashi | 257/310 |
| 6,515,957 B1 | 2/2003 | Newns et al. | |
| 6,579,754 B2 | 6/2003 | Suenaga et al. | |
| 6,636,433 B2 | 10/2003 | Tanikawa | |
| 6,642,539 B2 * | 11/2003 | Ramesh et al. | 257/43 |
| 7,065,033 B2 | 6/2006 | Onoe et al. | |
| 2001/0026468 A1 | 10/2001 | Tanikawa | |
| 2003/0062553 A1 | 4/2003 | Ramesh et al. | |
| 2003/0119271 A1 | 6/2003 | Aggarwal et al. | |
| 2004/0214352 A1 | 10/2004 | Kijima et al. | |
| 2005/0095389 A1 | 5/2005 | Newns | |
| 2005/0122005 A1 | 6/2005 | Higuchi et al. | |
| 2006/0083933 A1 | 4/2006 | Kijima et al. | |
| 2006/0088731 A1 | 4/2006 | Kijima et al. | |
| 2006/0124470 A1 | 6/2006 | Zama et al. | |

OTHER PUBLICATIONS

Doyle et al. "Transistor Element for 30 nm Physical Gate Length and Beyon", Intel Technology Journal, vol. 6, Issue 2, Section 5 or 9, Published May 16, 2002.*
Dennis Newns, "Ultra-High Density Ferroelectric Storage Medium Stabilized by Surface Conducting Layer", International Business Machines Report, Jul. 1, 2003.

(Continued)

*Primary Examiner* — Mark Ruthkosky
*Assistant Examiner* — Gary Harris
(74) *Attorney, Agent, or Firm* — McGinn IP Law Group, PLLC

(57) ABSTRACT

A method and structure for a ferroelectric storage medium, includes a metallic underlayer and a ferroelectric data layer over the metallic underlayer. A layer over the ferroelectric data layer has a charge migration rate faster than a charge migration rate of the ferroelectric data layer.

20 Claims, 5 Drawing Sheets

OTHER PUBLICATIONS

C. H. Ahn, T. Tybell, L. Antognazza, K. Char, R. H. Hammond, M.R. Beasley, O. Fischer, J.M. Triscone, "Local, Nonvolatile Electronic Writing of Epitaxial Pb($Zr_{0.52}Ti_{0.48}$)$O_3$/SrRuO$_3$ Heterostructures", Science, vol. 276, May 16, 1997, pp. 1100-1103.

T. Tybell, C.H. Ahn, and J.-M. Triscone, "Control and imaging of ferroelectric domains over large areas with nanometer resolution in atomically smooth epitaxial Pb($Zr_{0.2}Ti_{0.8}$)$O_3$ thin films," Applied Physics Letters, vol. 72, No. 12, Mar. 23, 1998, pp. 1454-1456.

Dong Weon Lee, Takahito Ono, and Masayoshi Esashi, "Recording on PZT and AgInSbTe thin films for probe-based data storage," IEEE 2002, pp. 685-688.

Fred P. Gnadinger, Gregory G. Huebner, Gary F. Derbenwick, and David A. Kamp, "Commercialization of 1T-Cell Ferroelectric Memories for Space Applications," Madrid 2001 FE Conference.

B. Nagaraj, J. Li, W. Cao, H.Y. Liang, C.H. Lee, and R. Ramesh, "Femto-second Laser Triggered Ultra-fast Switching Dynamics in Thin Film Ferroelectric Capactors", private communication.

* cited by examiner

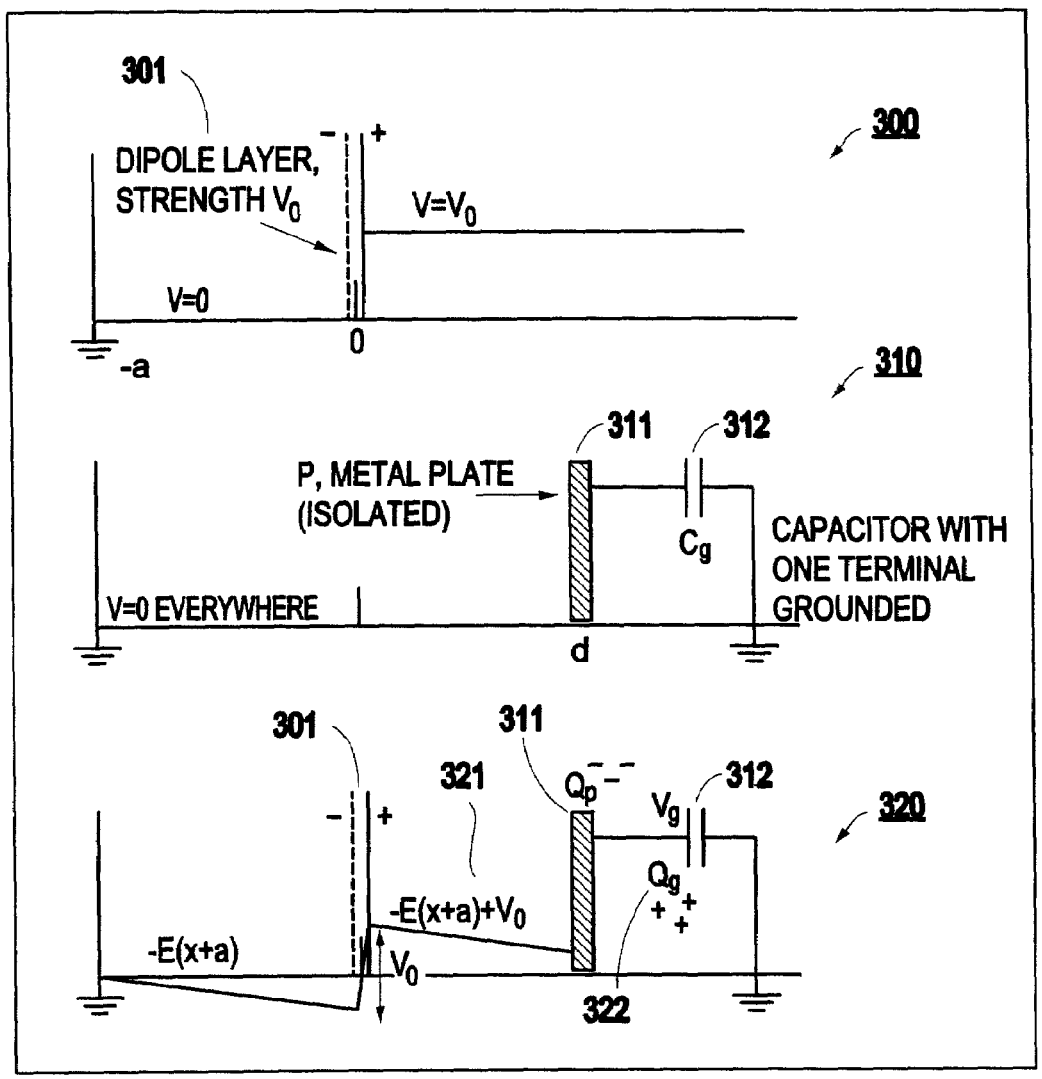
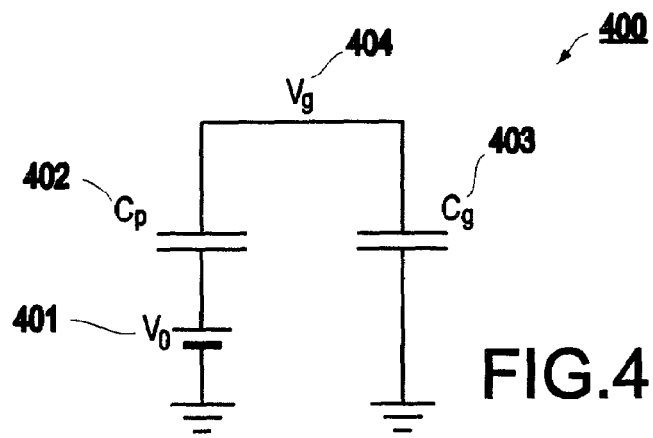
FIG.3
FIG.4

METHOD AND STRUCTURE FOR ULTRA-HIGH DENSITY, HIGH DATA RATE FERROELECTRIC STORAGE DISK TECHNOLOGY USING STABILIZATION BY A SURFACE CONDUCTING LAYER

This Application is a Divisional Application of U.S. patent application Ser. No. 10/697,271, filed on Oct. 31, 2003, now U.S. Pat. No. 7,754,353.

BACKGROUND OF THE INVENTION

1. Field of the Invention

The present invention generally relates to ferroelectric storage media, and more specifically, a ferroelectric storage medium including a thin surface layer having the characteristic that charge migration is much more rapid than the charge migration characteristic of the underlying ferroelectric layer.

2. Description of the Related Art

Storage density of all magnetic disk storage devices is currently increasing at a very high rate superior even to Moore's Law. Application strategies assume this continued growth. For example, the current "computing on demand" business strategies will require very large storage databases. At the opposite end of the scale, the continued development of hand held devices requires the availability of increasingly high density miniaturized storage systems.

Despite strategies based on the ever-increasing availability of higher density storage, the technical reality may be that magnetic disk storage technology is approaching limitations to further scaling improvement.

Magnetic disk storage density has been increasing faster than Moore's law, at an approximate factor of double per year, but scaling of magnetic storage engineering is showing signs of breakdown. Introduction of new techniques such as AFC (Antiferromagnetic Compensation layers) has been required to maintain scaling up to now, and further projected increases in storage density rely on the new technique of perpendicular recording.

However, perpendicular recording is a complex technology which has not yet been demonstrated successfully at the required high densities. It is questionable whether magnetic disk technology can be relied upon to increase storage density beyond approximately 100-200 Gb in$^{-2}$ (Gigabits per square inch).

Replacing magnetic storage media on the disk with ferroelectric media has the potential for much higher densities, since ferroelectric bits are on the scale of one nanometer. But, while magnetic dipoles cannot be depolarized by the nonexistent magnetic monopoles, the ferroelectric dipole can be. Without loss of its bulk polarization state, the surface change can be depolarized even by stray electric charges, posing serious problems for ferroelectric disk technology. So far, no solution to this surface depolarization problem is known for ferroelectric disk technology.

SUMMARY OF THE INVENTION

Therefore, in view of the foregoing problems, drawbacks, and disadvantages of the conventional systems, it is an exemplary purpose of the present invention to provide a structure and method for solving a surface depolarization problem for ferroelectric storage media, thereby ensuring reliable accessibility of the information stored therein in the form of polarized domains.

It is another purpose of the present invention to provide materials and thickness of materials that can be used in solving the above and other exemplary problem.

It is yet another purpose of the present invention to describe a read head appropriate for the inventive method.

It is yet another purpose of the present invention to describe a two-dimensional read sensor that will improve reliability and speed for the read operation of a ferroelectric storage media structured in accordance with the principles described herein.

To achieve these objects and aspects, as an exemplary first aspect of the present invention, described herein is a ferroelectric storage medium including a metallic underlayer, a ferroelectric data layer on top of the metallic underlayer, and a layer on top of the ferroelectric data layer having a charge migration rate faster than a charge migration rate of the ferroelectric data layer.

In a second exemplary aspect of the present invention, also described herein is a ferroelectric storage apparatus including a rotating support mechanism to support and rotate a ferroelectric storage medium, wherein the ferroelectric storage medium comprises a metallic underlayer, a ferroelectric data layer on top of the metallic underlayer, and a conducting layer on the ferroelectric layer. The apparatus also includes read head including an electrometric sensor and a write head.

In a third exemplary aspect of the present invention, also described herein is a method of manufacturing a ferroelectric storage medium, including applying a layer of metal on a carrier substrate to serve as a metallic underlayer. A layer of ferroelectric material is applied on top of the metallic underlayer, and a layer of conducting material is applied on top of the ferroelectric layer.

The present invention provides a solution to surface depolarization on ferroelectric storage surfaces, thereby permitting reliable ultra-high density storage.

BRIEF DESCRIPTION OF THE DRAWINGS

The foregoing and other objects, aspects and advantages will be better understood from the following detailed description of an exemplary embodiment of the invention with reference to the drawings, in which:

FIG. 3 shows models of potential 300, 310, 320 used to further explain the present invention;

FIG. 4 shows an equivalent circuit 400 useful for explaining the present invention;

DETAILED DESCRIPTION OF EXEMPLARY EMBODIMENTS OF THE INVENTION

Figure 1:
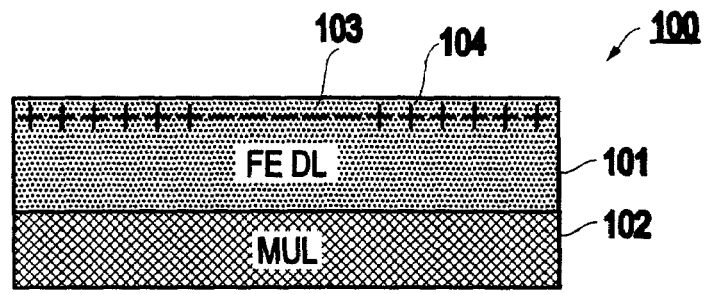
FIG. 1 shows a conventional ferroelectric storage medium 100.

Referring now to the drawings, and more particularly to FIGS. 1-7, exemplary embodiments that teach exemplary aspects of the present invention will now be described.

Described herein is a more detailed explanation for the above-mentioned surface depolarization problem associated with ferroelectric storage and a solution to this and other problems. That is, described herein is a method to make, and theoretically model, a disk based storage technology capable of 3000 Gb/in$^2$ (Gigabits per square inch) storage density. This density would be capable of addressing the demand for ultra-high density storage.

Moreover, the read/write data rate of the design also is extremely high, approaching $10^{11}$ b/s (bits per second), which is essential for several purposes. In particular, for example, whole-disk operations such as virus scan can be implemented in reasonable time, particularly when the present invention is implemented using the multiple sensor array to be described later.

Ferroelectricity is intrinsically a storage phenomenon capable of an enormous dynamic range of scaling, because energies are large and local in origin, with nanoscale domain walls. A switch from magnetic disk to ferroelectric (FE) disk storage could potentially provide the solution to continuing storage density scaling.

Because much of the materials technology required for FE disk storage can be taken over from FeRAM technology, the time and expense involved in research are much reduced for FE disk storage. In addition, many of the off-disk components can be carried over from the existing storage technology.

In FIG. 1, the storage in the exemplary FE disk 100 includes a layer 101 of FE material, deposited on a conducting substrate (MUL=metallic underlayer) 102. The electric polarization in the FE is directed up or down relative to the disk plane, and stores a bit denoted "1" or "0" according to the sign of the polarization (the polarization pattern may be encoded relative to the actual stored information).

The polarization is written with an electric field normal to the disk surface. The polarization of the FE film is terminated at the surface by a 'bound charge' of positive or negative sign 103, 104 according to the sign of the polarization. The bit can be read out by with a sensitive high speed electrometric preamplifier, which detects the sign of the bound charge, and thus the bit polarity.

U.S. Pat. No. 6,515,957 to Newns et al., incorporated herein by reference, describes in more detail this broad concept.

Initial studies have successfully demonstrated the capability to electrically write patterns on FE surfaces on the scale of 1000 Å or less. But a major problem emerged in the observation of a slow surface depolarization of the polarization-written information.

The problem which emerged in the initial experimental studies of writing information by vertical polarization of a FE surface, was the slow loss of surface polarization over a few-hour to 24-hour time scale. This effect is not a loss of bulk polarization in the FE film, but was found to be due to the accumulation of mobile surface charges which neutralize the bound charges constituting the surface polarization, as illustrated conceptually in the top panel of FIG. 2.

The slow surface depolarization phenomenon poses a severe problem for the FE disk. That is, the extended time scale of the ill-defined depolarization process means that the state of the surface is often an indefinite one, between charged and neutral. Hence, the read process cannot be engineered predictively, since prior to surface depolarization the surface is charged, while after surface depolarization the surface charge distribution has been replaced by a surface dipole layer.

Figure 2:
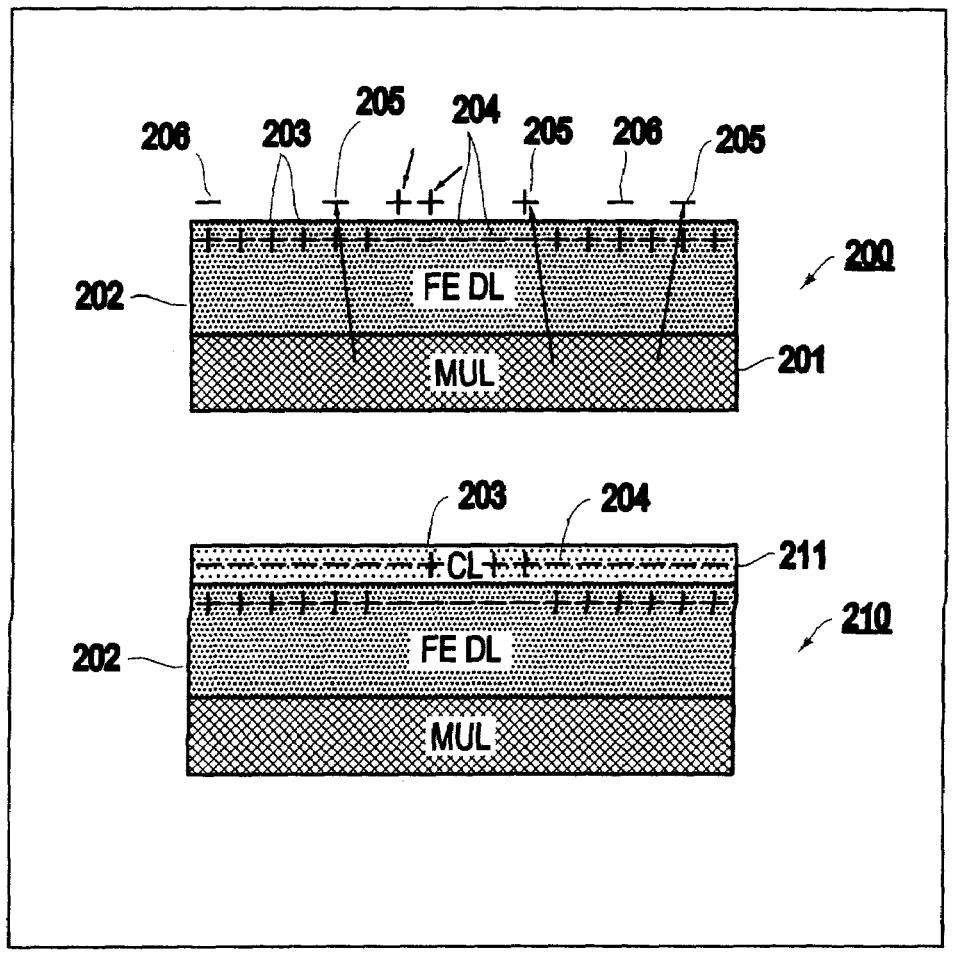
FIG. 2 illustrates the extraneous charge problem 200 and an exemplary solution disclosed in the present invention to this problem by using a conductive surface layer 204.

The top panel of FIG. 2 shows a ferroelectric storage medium 200 having MUL (Metallic Underlayer) 201 and FE DL (Ferroelectric Data Layer) 202, and bound charges associated with 'up' polarized domains (+) 203 and with 'down' polarized domains (−) 204. Also shown in this upper panel are extraneous charges, from the MUL 205 or from gas phase 206, that neutralize the bound charges 203, 204.

It should be noted that these extraneous charges do not destroy the information in the FE DL 202, but they do compromise the ability to read the polarized domains in the FE DL 202.

The present invention describes a solution to deal with the above-described surface depolarizing charge problem. The lower panel of FIG. 2 shows ferroelectric storage medium 210 similar to that of the upper panel.

If, as shown in the lower panel of FIG. 2, a grounded conducting layer (CL) 211 is deliberately introduced on top of the FE layer 202, then the bound charges are neutralized in a well-defined manner by conduction within the CL.

That is, assuming the CL 211 is a good conductor, the surface depolarizing charge migration will occur very rapidly. The charge state of the surface is then determined at all times. Stated slightly differently, by providing a surface in which charges can migrate rapidly relative to the above-described time of several-to-24 hours, the present invention provides stability to the FE storage device.

The surface charge distribution can be engineered to produce a well-defined potential $\pm V_0$, just outside the CL surface, the sign depending on the sense of the FE local polarization, whose magnitude is suitable as a read input to an electrometric sensor as described in the next section.

By fixing the problem of slow surface charge depolarization, the ferroelectric storage medium solution becomes viable, provided it can be demonstrated that:

1. The read process is viable when the surface charge distribution is a dipole layer;
2. The CL can indeed redistribute the neutralizing charges rapidly enough;
3. A satisfactory voltage swing $\pm V0$ is obtained for the read sensor with realistic materials and dimensions;
4. The write process remains viable;
5. A practical read sensor can be designed; and
6. The data transfer rate in read and write is adequate.

In the following, and in more detail in D. M. Newns, "Ultra-High Density Ferroelectric Storage Medium Stabilized by a Surface Conducting Layer", IBM Report, Jul. 1, 2003, it is demonstrated that these above-identified six issues can be satisfactorily dealt with in a practical design.

Electrometric Read with Dipole Layer

First the qualitative issue of electrometric readout from a surface dipole layer is addressed. In the bottom panel of FIG. 2, the disk surface, including the FE polarization, the CL charge, and their images in the MUL, is always neutral (it would be so even in the absence of the CL, though the CL reduces the strength of the dipole layer significantly).

Electrostatically, the polarized FE layer presents a dipole layer, across which there is a voltage $\pm V_0$, the sign depending on the sense of the FE polarization, between air just outside the medium surface and the grounded MUL. But there is no field normal to the surface in air, so it may at first seem that there is no electric field source for the read sensor.

Hereinbelow, it is explained, from simple electrostatics, how electrometric read is possible under these conditions. Essentially, when the read plate is put in position, the charges rearrange themselves to minimize energy, resulting in a field which charges the read amplifier input capacitance.

Referring to FIG. 3, a simple model is presented to show how this process works. The top panel 300 of FIG. 3 shows dipole layer 301 having strength $V_0$ atop grounded metal underlayer (ML) 302. Outside the dipole layer 301, there is no field, but the potential is $V_0$.

The middle panel 310 shows an isolated metal plate 311 with capacitance Cg 312 to ground. The bottom panel 320 shows the metal plate 311 located atop dipole layer 301, thereby generating a field E 321 and charge Qg 322 on the capacitor 312.

That is, in FIG. 3, the FE+CL is represented as a dipole layer 301 of strength $V_0$. In the absence of a read plate the dipole layer atop the conducting, grounded MUL produces a potential $V_0$ in air, with no field (e.g., the top panel 300 in FIG. 3).

The read capacitance is an isolated metal plate P 311, at x=d, connected via a capacitor Cg 312 to ground. In the absence of a dipole layer 301, the potential is zero everywhere (e.g., the center panel 310 in FIG. 3).

Now, the dipole layer and read plate are introduced together (e.g., the bottom panel 320 in FIG. 3). As developed in the above-referenced IBM Report dated Jul. 1, 2003, the voltage on the read sensor 311 is:

$$V_g = V_0/(1 + C_g/C_p), \quad (1)$$

where the plate capacitance Cp is defined as $$C_p = \frac{A}{4\pi(a+d)}, \quad (2)$$

The electric field and capacitor voltage have become non-zero (a similar situation occurs in the well-known Kelvin probe).

The read signal can be modeled by the equivalent circuit 400 in FIG. 4, and can be interpreted as the dipole layer, acting like a battery 401, in series with the potential divider formed by the two capacitances Cp 402 and Cg 403. The capacitance Cp 402 is much smaller than Cg 403, which results in a significant reduction in read sensor input (e.g., see Equation (1) above, and the description below).

The voltage Vg 404 will be the input voltage on an FET (not shown in FIG. 4), whose gate capacitance is Cg 403. In its practical realization, the floating gate is eliminated from the read sensor design, to give direct coupling between the FE medium and the sensor FET channel, as seen below.

Figure 5:
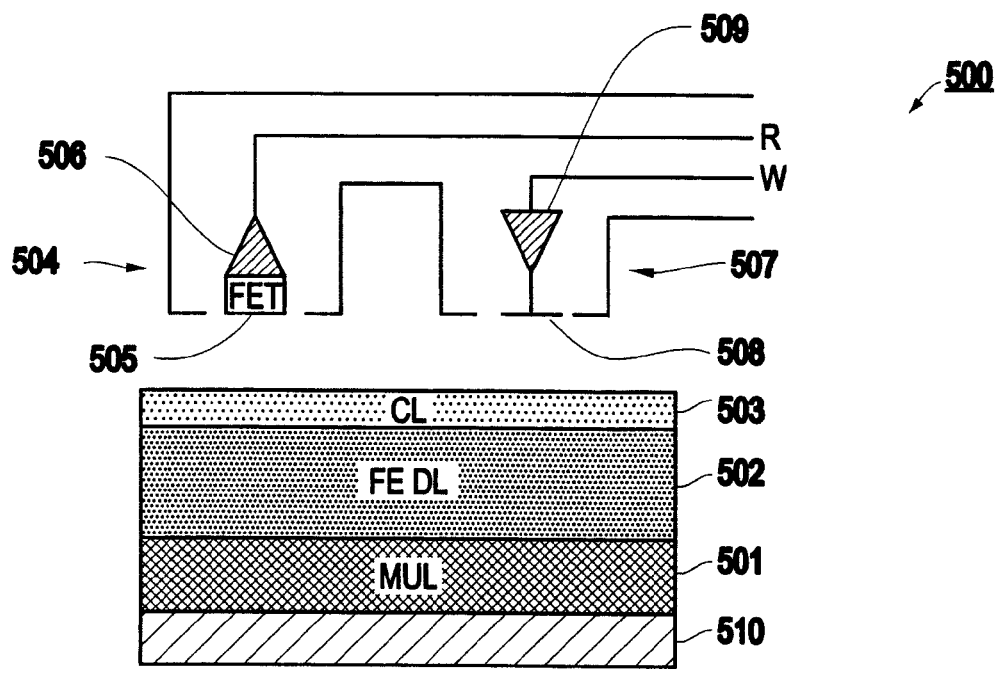
FIG. 5 shows an exemplary outline of the device 500 resulting from the method taught in the present invention.

Structure 500 of the FE disk design is shown in FIG. 5. The active part of the disk includes a Metallic UnderLayer, MUL 501, the ferroelectric Data Layer 502, and a top coating, the Conducting Layer CL 503. The MUL 501 may be formed of a metal or other conducting medium. For example, 30 Å of SrRuO$_3$ was used as the MUL in the structure described in Ahn et al., Science 276, 1100, 1997. A substrate 510 supports the above structure.

The DL 502 preferably is a thin layer (e.g., on the order of tens of angstroms) of the insulating ferroelectric data storage material, with FE polarization P. The CL 503 preferably is a thin layer of conducting material, such as amorphous Si or a doped perovskite conductor. A thickness preferably is within a range from about 5 Å to about 25 Å, and more preferably about 15 Å. The MUL 501 and CL 503 are electrically grounded.

The read head 504 preferably is an electrometer sensor including an FET input stage 505, which is the preamp for a read amplifier 506. The write head 507 includes a write plate 508 connected to the output of a write amplifier 509.

In operation, the write plate 508, driven by the write amplifier 509, forms one plate of a capacitor, with the other plate being the grounded MUL. The electric field normal to the disk produced by the write plate 508 polarizes the FE layer 502 beneath the plate 508, normal to the surface, and in the sense of the field.

The read sensor 504 picks up variations in potential present due to the difference in potential above the 'up' and 'down' polarized bits, and amplifies them, enabling readout of the sense (e.g., "0" or "1") of the bit.

The FE 502 preferably is a good insulator, is polarizable by the write field, and is capable of response within the required time frame.

The CL 503 preferably is a good conductor, and has an appropriate charge profile and energy level structure to enable efficient read and write operation.

An exemplary test case is now described for analysis. This must be an aggressive one, and a 3000 Gb/in$^2$ storage medium is analyzed here and in more detail in other specifications. In Table I, the first two columns give the bit dimensions, a and b refer to the thickness of the FE 502 and CL 503 layers respectively, d is the fly height between the top of the CL 503 and the bottom of the R/W head 504,507, and $v_{disk}$ is the disk velocity:

TABLE I

| Test Case Parameters | | | | | | |
|---|---|---|---|---|---|---|
| ψTrack (Å) | ζTrack (Å) | a (Å) | b (Å) | d (Å) | $V_{disk}$(ms$^{-1}$) | $\omega_{R/W}$(ns) |
| 100 | 200 | 100 | 15 | 30 | 40 | 0.3 |

The read/write time $\tau_{R/W}$ follows from the bit length and disk velocity and is a key input.

The MUL Layer 501

As described in the above-cited article by Ahn et al., 30 Å of SrRuO$_3$ was used as the MUL 501, deposited onto an STO (SrTiO$_3$) substrate. The MUL 501 is not considered critical as regards its electronic properties. However, its material's properties are key as a substrate for the FE layer 502.

The FE Layer 502

Table II shows a set of FE materials which have been proposed in the FeRAM field. This area has very similar materials requirements to those of FEdisk technology.

Listed in the table are FE polarization P, coercive field Ec, and FE dielectric constant $\epsilon_{ox}$.

TABLE II

| Ferroelectric Materials | | | |
|---|---|---|---|
| Material | P (μCcm$^{-2}$) | $E_c$(KV/cm) | $\epsilon_{ox}$ |
| PZT (Pb(Zr$_x$Ti$_{1-x}$)O$_3$) | ~50 | 100-200 | 40-2000 |
| SBT (SrBi$_2$Ta$_2$O$_9$) | 6, 14 | 54 | 124, ~200 |
| BaMgF$_4$ | 3-8 | ? | 7 |
| STN (Sr$_2$(Ta$_{1-x}$Nb$_x$)$_2$O$_7$) | 0.4 | 30 | 55 |
| NFM (COVA) | 0.2 | 50 | 7-12 |

Results for any material depend on preparation, and in the cases of variable composition, also on composition. They are listed in approximate order of the FE polarization P, which varies over more than two orders of magnitude. The listing also turns out to be approximately the order of their dielectric constants $\epsilon_{ox}$.

In contrast, the critical field Ec does not vary very much from material to material (though the PZT value is significantly larger, making it more stable). The last line of the Table is a proprietary material developed by the COVA Corporation, termed "NFM" (New Ferroelectric Material). Experimental data on PZT show that response times can be sufficiently short relative to $\tau_{R/W}$. Similar data on the other materials in Table II is not currently available.

Modeling studies during development of the present invention have focused on the materials SBT and STN, with polarization lying in the intermediate range.

PZT can also be used as the FE material, relative to SBT and STN, its higher polarization relative to $E_c$ leads to a stronger tendency to depolarize, and to a requirement for relatively higher carrier concentration in the CL. Its read signal is relatively large, and, similarly, a larger write field is required relative to SBT and STN.

The NFM material leads, on the contrary, to a low requirement on CL carrier concentration, and to lower read signals and write fields relative to SBT and STN.

The Conductive Layer CL

The CL preferably is a good conductor and enables field penetration normal to the disk plane. That is, it cannot completely shield the FE from the read and write plates.

1. CL Conductance

The resistance R per square times the capacitance C of the bit defines a time constant for lateral charge dissipation in the CL. This preferably is shorter than $10^{-10}$ seconds to enable charge response within the read/write time $\tau_{R/W}$. Hence, one obtains the condition:

$$RC < 10^{-10} s \qquad (3)$$

The carrier density in the CL can be assumed to be at least equal to the FE polarization P. Hence, inserting $R=1/(P\mu)$, where $\mu$ is the mobility of the carriers in the CL, a constraint on the mobility is:

$$\mu < 10^{10} \frac{C}{P} = 0.03 \, cm^2 \, V^{-1} s^{-1}. \qquad (4)$$

Here $C = \epsilon_{ox} \epsilon_0 A/a$, where A is bit area, and assume $\epsilon_{ox} = 1000$ for PZT, giving a close to maximal value for the required CL mobility. The requirement on the mobility is seen not to be severe. It can be satisfied by amorphous Si or by a doped perovskite conductor.

A perovskite, in its simplest pure form, is a material of formula $ABO_3$, where B is a transition metal and A is a divalent metal (e.g., $SrZrO_3$).

2. Shielding by CL of the FE Medium from Read/Write Heads

Shielding by the grounded CL inhibits sensing of the FE polarization by the read head, and also penetration of external write fields into the FE medium. Shielding places severe constraints on the CL, decreasing the available read voltage, and increasing the required write voltage.

A measure of the effectiveness of shielding is the Fermi Thomas screening length $\lambda^{-1}$ in the layer versus the CL layer thickness b, where $\lambda$ is given by $$\lambda^2 = \frac{4m^*}{r_B \varepsilon} \left[ \frac{3n_{3D}}{\pi} \right]^{1/3}, \qquad (5)$$

$m^*$ being effective mass, $\epsilon$ is the CL background dielectric constant, $n_{3D}$ is the carrier concentration in the CL, and $r_B$ is the Bohr radius. If $$\lambda b \gg 1 \qquad (6),$$

then shielding is highly efficient, which is an undesirable result. However, for reasonable values of CL carrier concentration and dielectric constant, $\lambda^{-1}$ can be made several Å, and for layers of thickness $b \approx 15$ Å, the shielding can be made acceptable. The shielding effect will limit CL layer thickness to below approximately 20 Å, depending on CL material.

Particular cases will be investigated in the following.

It will typically be assumed that the aerial carrier concentration in the CL is $N = 2P/e$. This ensures that, as a result of screening the FE polarization P, the carrier concentration is bounded between the limits $P/e$ and $3P/e$, for bits of depletive/accumulative sign respectively, remaining not only nonzero, but allowing close to linear screening of the FE polarization by the CL to be maintained.

Two practical choices for the CL are particularly attractive. One choice is Si, and the other is doped perovskite or similar oxide.

3. Silicon CL

There is extensive experience in the FeRAM field with the FE/Si interface. The doping in a Si layer can be readily controlled. The required doping is, however, extremely heavy. A 15 Å layer with $N = 2P/e$ requires $2.5 \times 10^{21}$ cm$^{-3}$ for PZT and $3 \times 10^{20}$ cm$^{-3}$ for SBT.

The layer is exemplarily deposited as amorphous Si. The mobility is adequate to satisfy condition (4) for this application. An advantage of Si is that it can readily be given a thin layer of $SiO_2$ as protection. Additionally, its parameters are well known.

For degenerate p-type Si, the formula for the FT screening length is $$\lambda^2 = \frac{4\sqrt{2}}{\pi \, \epsilon} E_F^{1/2} (m_{lh}^{3/2} + m_{hh}^{3/2}), \qquad (7)$$

where $E_F$ is Fermi energy w.r.t. VB edge, and $m_{lh}$ and $m_{hh}$ are the light and heavy hole masses.

The shielding effect was modeled in detail. The results herein are based on linear screening theory, for a CL thickness of b=15 Å (giving 12 layers of Si atoms), doping is p-type, the carrier density has been chosen so that the aerial carrier density is twice the polarization of the FE, thus ensuring that the FE polarization can be neutrally screened for either bit polarization.

Results are shown in Table III for SBT and STN. The Table includes the assumed values of Polarization P, and FE dielectric constant $\epsilon_{ox}$. The read potential is given in the form of the transition potential $\Delta V_R$, the difference between the potential on the top surface of the CL for a positively-upward FE polarization, and that for a negatively-upward polarization.

The Table also includes the write voltage at the write plate required to generate the critical field $E_c$ in the FE medium.

TABLE III

| Results for 15Å Si CL | | | | |
|---|---|---|---|---|
| FE | P(\|e\|/cell) | $\epsilon_{ox}$ | $\Delta V_R$(mV) | $V_W$(V) |
| SBT | 0.06 | 150 | 56 | 34 |
| STN | 0.004 | 50 | 20 | 5.5 |

The transition potential $\Delta V_R$ at the CL surface is in the tens of millivolt range. It is undesirably small due to CL shielding, but is detectable by a specialized electrometer sensor head described below. The write voltage is of order tens of volts and seems practical. The write issue is not further discussed, as it is non-critical to the present invention.

4. Transition Potential

Figure 6:
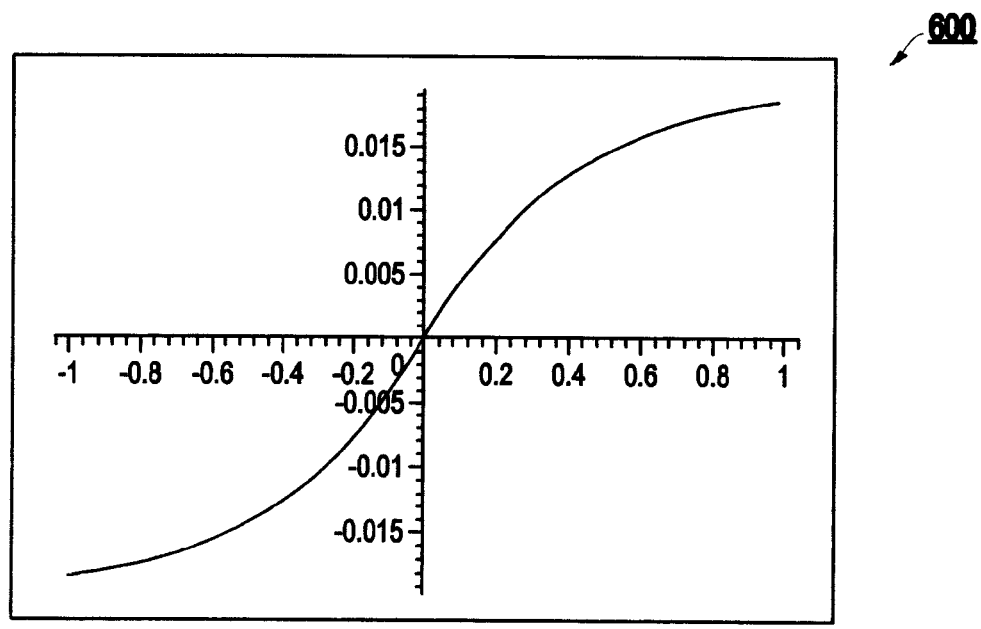
FIG. 6 shows an exemplary graph 600 of the potential at the CL/air interface for the case of SBT.
Figure 7:
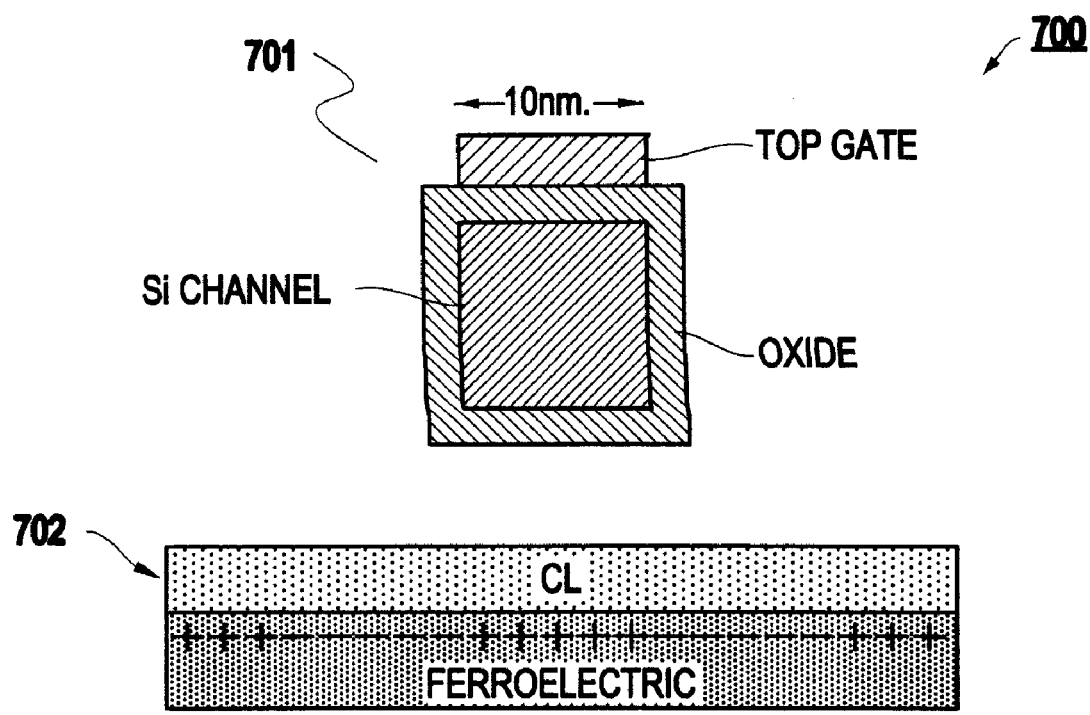
FIG. 7 shows a structure 700 including an exemplary electrometer open-gate FinFET sensor 701 and a ferroelectric storage medium 702, in another exemplary aspect of the present invention.

For the same p-type Si model, one can calculate the transition potential V(x) at the CL surface at the interface between a positively polarized and a negatively polarized bit. Again using a linearized Fermi Thomas model, the potential is illustrated in FIG. 6. FIG. 6 shows the potential at the CL/air interface for the SBT case, with the vertical axis in volts, and the horizontal axis in units of 50 Å.

As shown, the transition occurs within one half a bit length on each side of the transition. The transition magnitude is somewhat less than for the uniformly polarized surface, being reduced from 56 mV to 38 mV, but this is still a workable transition.

5. Doped Perovskite CL

An alternative to heavily doped Si is a doped perovskite or similar oxide with compatibility to the FE surface, or even a few doped surface layers of the FE itself.

The required doping levels of up to $3 \times 10^{20}$-$3 \times 10^{21}$ cm$^{-3}$ are normal for perovskite semimetals. The mobility is adequate to satisfy condition (4) above. In the above-cited Ahn article, a 30 Å layer of SrRuO$_3$ was described as successfully deposited with 1.5 Å roughness over a 6×6 μm$^2$ area. Therefore, depositing one half of this thickness of perovskite, as required, is easily attainable.

The parameters for perovskite are less well known than for silicon, a disadvantage in modeling. Consider a layer of doped perovskite located (epitaxially, if the substrate/CL lattice match allows it) atop the FE. The thickness is typically b=16 Å, i.e., n=4 unit cells of perovskite. As a benchmark, 30 Å of SrRuO$_3$ was successfully deposited in the technique described in the Ahn article, with 1.5 Å roughness.

The perovskite CL is assumed to be n-doped, when the Fermi level lies in the perovskite transition metal d-band (e.g., at the bottom of the 3d band for STO). Since the transition metal forms a simple cubic lattice with a narrow band, it is modeled by tight-binding theory, taking into account the finiteness of the film by eliminating the hopping integrals from the first layer of the film to the non-existent zeroth layer, and from the nth layer to the non-existent (n+1)$^{th}$ layer.

In the in-plane directions, the layer is taken as infinite. As before, the aerial doping of the CL is taken as two times the FE polarization. The modeling details are further outlined in "Ultra-High Density Ferroelectric Storage Medium Stabilized by a Surface Conducting Layer", D. M. Newns, IBM Report, Jul. 1, 2003.

The dielectric constant of the CL is $\epsilon$, the band mass is m, and a simple s-type band structure is assumed for simplicity. Results are shown in Table IV.

TABLE IV

Results for n = 4 Perovskite CL Model

| $m/m_e$ | $\epsilon$ | $\epsilon_{ox}$ | P (|e|/cell) | V (0) (mV) | ΔV (mV) |
|---|---|---|---|---|---|
| 1 | 20 | 150 | −0.06 | −23.5 | 49.5 |
| 1 | 20 | 150 | 0.06 | 26.0 | |

This model is not linearized, so the potential V(0) at the surface of the CL depends somewhat on the sign of the polarization. The transition potential is again 50 mV, about the same value as in the quite different Si calculation for a similar layer thickness.

The Electrometric Sensor
FinFET Input Stage

A conceptually simple exemplary design for the electrometric sensor is based on some radical modifications to the 20 nm channel length FinFET described recently by Doyle, et al., "Transistor Element for 30 nm Physical Gate Length and Beyond", Intel Technology Journal, Vol. 6, Issue 2, Section 5 of 9, published May 16, 2002 (available on the Internet at http://www.intel.com/technology/itj/2002/volume06issue02/art05_transistorarch/p05_architecure.htm).

Referring back to the read head 504 in FIG. 5, on one side of the Si fin a standard top gate is located, mainly for bias purposes. The opposite side of the channel is gate-free, with the CL as the effective (but weakly coupled) gate carrying the high frequency input signal. The axis of the 20 nm channel (e.g., the source/drain axis), is oriented transverse to the track, so as to match the 20 nm bit width. The width of the FinFET channel is approximately 10 nm, and is designed to match the bit length (the described design had a 13 nm wide channel).

An analysis of this sensor, which acts as the read input preamplifier, is provided in the above-cited IBM report by Newns. The output voltage is about 0.1 V, which greatly exceeds Johnson noise, and the output impedance is adequate for the next amplification stage, given the required bandwidth.

The amplifier should contain a high-pass filter to remove any low-frequency sources of noise (1/f noise). An additional source of noise will be charge fluctuations in or on the sensor oxide, which sometimes may be fast events, such as sporadic tunneling events, not eliminated by the high pass filter.

If these rapid charge fluctuation events occur at a low enough rate (e.g., such as below one in 10$^5$ bit reads) to be captured by the decoder error correction, they will have no effect. If not, hardware fixes exist at some increased complexity (see below).

Multiple FinFET Sensor Array

There are advantages to using a multiple sensor array, which can be readily manufactured by the same lithographic means as the individual FinFET sensor. Sensors, and associated write heads, can be placed on parallel tracks, in order to increase the speed of data transfer (an important consideration in ultra high density storage). Different along-track mutual displacement of the bits and sensors in different tracks will be introduced to reduce crosstalk.

Secondly, multiple sensors can be placed along the same track. By combining the digitized output from each along-track sensor with an appropriate delay, and polling the resulting set of signals, a significant reduction in signal/noise can be obtained. In this way, the effect of relatively high occurrence rate rapid charge fluctuation events associated with the sensor oxide can be eliminated.

Figure 8:
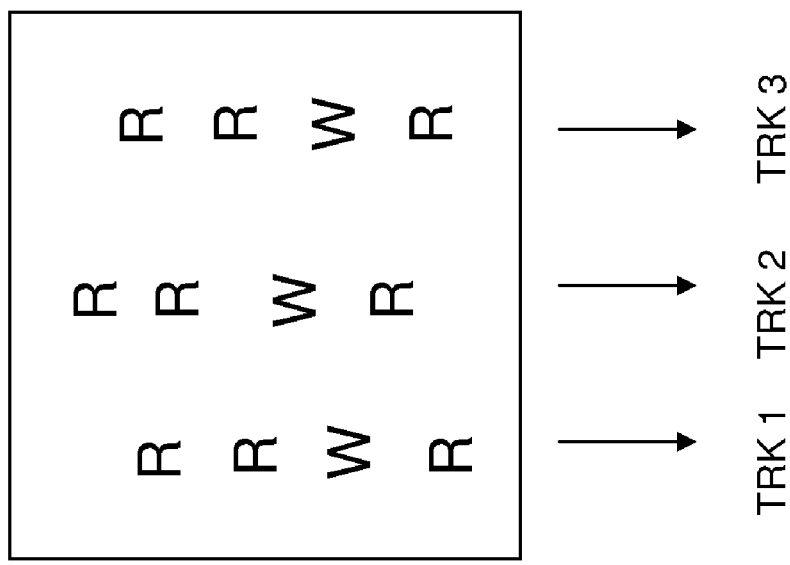
FIG. 8 shows exemplarily the aspect of the present invention in which an access head 800 comprises a multiple FinFET sensor array.

FIG. 8 shows exemplarily the multiple FinFET sensor array described above.

A ten parallel track R/W head will have a data rate of 0.4×10$^{11}$ b/s, enabling a 3 in. disk to be written and read in about 20 minutes, which should be adequate.

In sum, the FE disk is an attractive candidate for an ultra high density storage medium. However, FE media seemed inoperable due to the existence of a slow surface charge depolarization problem.

The present invention provides a solution to the depolarization problem, which is, for example, in the exemplary embodiment, to deposit on the surface of the FE disk a high mobility conducting layer, thus placing the FE in equilibrium with a uniform chemical potential. Hence, slow electronic charge rearrangements have no driving force. The layer also stabilizes the bulk polarization in the FE, by reducing depolarizing fields.

If the CL is made reasonably thin (e.g., within a range of about 5-25 Å), and of appropriate material (e.g., amorphous Si or a doped perovskite conductor), the electric field seen by an external electrode is sufficient to enable read and write functionality of the bit, for both Si and perovskite conducting layers.

The read process involves electrometrically sensing the transition potential between oppositely polarized bits, which is found to be adequately sharp. The read sensor analyzed above involves a FinFET with exposed sides and top, the CL forming a weakly-coupled bottom gate.

A simple preamplifier with adequate signal/noise and output impedance is
then formed by the sensor and output resistor. A degree of uncertainty is provided by the possibilities for charge noise in/on the exposed gate oxide. The noise from this process can be greatly ameliorated in a sensor array design.

The write process involves a simple write plate at some tens of volts, and is considered non critical. Multiple R/W channels can be lithographed in the sensor array design, enabling R/W data rates approaching $10^{11}$ bits per second.

Thus, the present invention maintains surface charge stability in the FE disk medium, while maintaining read and write capability.

While the invention has been described in terms of an exemplary embodiment, those skilled in the art will recognize that the invention can be practiced with modification within the spirit and scope of the appended claims.

Further, it is noted that, Applicant's intent is to encompass equivalents of all claim elements, even if amended later during prosecution.

Having thus described my invention, what I claim as new and desire to secure by Letters Patent is as follows:

1. A memory apparatus, comprising
   a ferroelectric storage medium comprising a metallic underlayer, a ferroelectric data layer over said metallic underlayer, and a conducting layer over said ferroelectric layer;
   a support mechanism to support and move said ferroelectric storage medium; and
   an electrometric read/write head for accessing said ferroelectric storage medium, for at least one of writing information to said ferroelectric storage medium and reading information from said ferroelectric storage medium,
   wherein:
   said ferroelectric data layer serves as a layer for storing information as bits defined by a sign of polarization of domains within said ferroelectric data layer, each polarized domain comprising a volume dipole polarization within said ferroelectric data layer and including an area of bound charge on and adjacent to a surface of said ferroelectric data layer, and
   said conducting layer has a charge migration rate faster than a charge migration rate of said ferroelectric data layer, thereby providing a charge dissipation of mobile surface charges on said ferroelectric data layer surface while still permitting said polarized domains to be read.

2. The memory apparatus of claim 1, wherein said electrometric read/write head includes an electrometric sensor for reading information from said ferroelectric storage medium.

3. The memory apparatus of claim 2, wherein said electrometric sensor comprises:
   an open-gate finFET.

4. The memory apparatus of claim 1,
   wherein said electrometric read/write head head comprises a plurality of electrometric sensing elements, said plurality of electrometric sensing elements being arranged linearly in at least one dimension.

5. The memory apparatus of claim 4, wherein said plurality of electrometric sensing elements are arranged in an x-axis dimension and in a y-axis dimension.

6. The memory apparatus of claim 1, wherein said information is stored on said ferroelectric storage medium on a scale of 1000 Å (Angstrom) or less.

7. The memory apparatus of claim 2, wherein a dimension of said electrometric sensor matches a dimension of said polarized domain.

8. The memory apparatus of claim 7, wherein said dimension is approximately 10 nm.

9. The memory apparatus of claim 5, wherein a read/write data rate approaches 1011 bits per second.

10. The memory apparatus of claim 1, wherein said polarized domains are oriented as being substantially normal to said top surface.

11. The memory apparatus of claim 1, wherein said information is stored as bits of information, each bit comprising a polarized domain within said ferroelectric data layer that is terminated at said top surface as an area of bound charge on said top surface, said bound charge having one of a positive sign and a negative sign, depending upon an information content of said polarized domain.

12. The memory apparatus of claim 1, wherein said layer over said ferroelectric data layer comprises silicon.

13. The memory apparatus of claim 1, wherein said charge migration time in said layer over said ferroelectric data layer is less than $10^{-10}$ second.

14. The memory apparatus of claim 1, wherein said layer over said ferroelectric data layer directly contacts a top surface of said ferroelectric data layer to protect against a surface depolarization of said ferroelectric data layer.

15. The memory apparatus of claim 1, wherein said electrometric read/write head comprises:
   a plurality of read heads mounted on said read/write head, each said read head comprising an electrometric sensor for detection of a sign of polarization of domains within a ferroelectric data layer of a ferroelectric storage medium; and
   a plurality of write heads also mounted on said read/write head, each said write head comprising a plate of a capacitor structure to thereby produce an electric field substantially normal to said ferroelectric data layer, thereby selectively writing said polarized domains into said ferroelectric data layer.

16. The memory apparatus of claim 15, wherein each said read head comprises a gate of a FinFET transistor.

17. The memory apparatus of claim 16, wherein an axis of a channel length of each said FinFET transistor is approximately 20 nanometers (nm) and is oriented transverse to a recording track on said ferroelectric storage medium, so as to match a 20 nm bit width of said recording track, said channel length axis being an axis of a source/drain of said FinFET, and a width of said FinFET channel is approximately 10 nm, so as to match a bit length along said recording track.

18. The memory apparatus of claim 15, wherein said plurality of read heads and said plurality of write heads are placed in parallel tracks to increase a speed of data transfer.

19. The memory apparatus of claim 18, wherein different along-track mutual displacement of bits and sensors are provided, to reduce a crosstalk between tracks.

20. The memory apparatus of claim 15, wherein multiple sensors are placed in a same track, thereby digitized outputs from said multiple sensors can be combined, with appropriate delays, thereby to improve a signal/noise of reading said track.

* * * * *